United States Patent [19]
Yoshizaki et al.

[11] Patent Number: 5,534,785
[45] Date of Patent: Jul. 9, 1996

[54] INTEGRATED CIRCUIT BARE CHIP CARRIER

[75] Inventors: Tsutomu Yoshizaki; Shigeyuki Maruyama; Tsuyoshi Ohno, all of Kawasaki, Japan

[73] Assignee: Fujitsu Limited, Kawasaki, Japan

[21] Appl. No.: 495,149

[22] Filed: Jun. 27, 1995

Related U.S. Application Data

[63] Continuation of Ser. No. 138,071, Oct. 20, 1993, abandoned.

[30] Foreign Application Priority Data

Oct. 20, 1992 [JP] Japan ................................. 4-281378

[51] Int. Cl.⁶ ............................. G01R 1/073; G01R 31/02
[52] U.S. Cl. ................................. 324/758; 324/755
[58] Field of Search ................................. 324/758, 754, 324/755, 761, 762

[56] References Cited

U.S. PATENT DOCUMENTS

| | | | |
|---|---|---|---|
| 4,899,107 | 2/1990 | Corbett et al. | 324/158 F |
| 5,173,451 | 12/1992 | Kinsman et al. | 324/158 F |
| 5,291,127 | 1/1994 | Park et al. | 324/158 F |
| 5,302,891 | 4/1994 | Wood et al. | 324/158 F |

*Primary Examiner*—Ernest F. Karlsen
*Attorney, Agent, or Firm*—Staas & Halsey

[57] ABSTRACT

An IC bare chip carrier installs an IC bare chip for performing a burn-in test and a functional examination of the bare chip. The carrier consists of an installing unit for installing the bare chip and an interconnecting unit for electrically interconnecting chip electrodes of the bare chip with output electrodes of the interconnecting unit, to be connected to apparatus for the burn-in test and the functional examination. The installing unit is made of aluminium nitride having an expansion rate near of material, ceramic, of the IC bare chip, for making fabrication of installing surface of the IC bare chip easy. The interconnecting unit has an air exchange mechanism by which the IC bare chip can be laid in a space, made by combining the installing unit and the interconnecting unit, constantly filled with inert gas such as nitrogen. The IC bare chip is transported anytime and anywhere as installed in the carrier without being contaminated.

6 Claims, 7 Drawing Sheets

INTEGRATED CIRCUIT BARE CHIP CARRIER

This application is a continuation of application Ser. No. 08/138,071, filed Oct. 20, 1993, now abandoned.

BACKGROUND OF THE INVENTION

1. Field of the Invention

The present invention relates to an integrated circuit bare chip carrier for carrying an integrated circuit bare chip, and in particular, the present invention relates to the integrated circuit bare chip carrier including interconnecting wiring for connecting an integrated circuit on the bare chip installed in the carrier, with exterior of the carrier and having an airtight mechanism for sealing the installed bare chip from the atmosphere around the carrier, to provide for a burn-in test of the bare chip.

2. Description of the Related Art

Usually, a single integrated circuit bare chip is packed in a package of a semiconductor device. However, as circuit density and functional variety of an integrated circuit on the single integrated circuit bare chip increase, a plurality of integrated circuit bare chips begin to be packed in the package. The integrated circuit bare chip will be called "IC bare chip", a plurality of integrated circuit bare chips to be packed to a semiconductor device will be simply called "multi-chips" and a semiconductor device including the multi-chips will be called "multi-chip semiconductor device" hereinafter.

Figure 1:
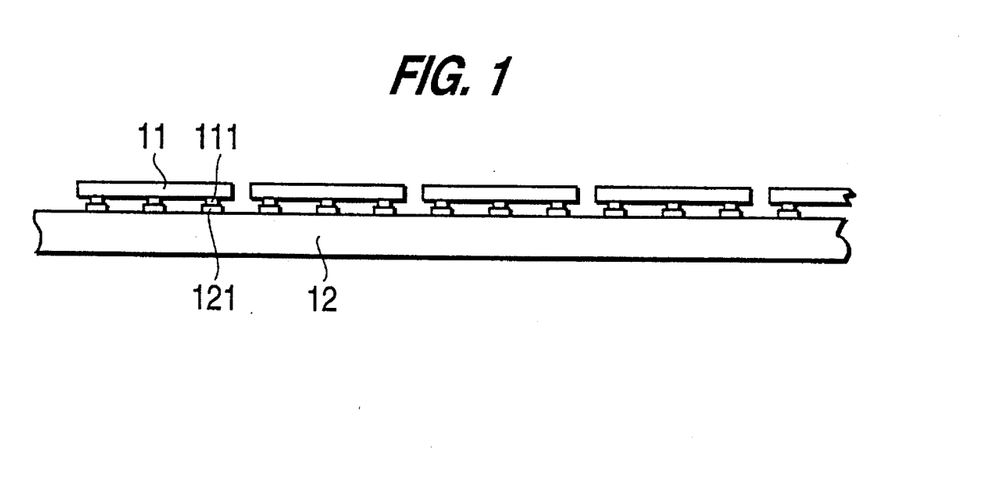
FIG. 1 is illustration for showing multi-chips installed on a printed circuit board.

A multi-chip semiconductor device is fabricated as shown in FIG. 1. In FIG. 1, multi-chips (11) are installed on a printed circuit board (PC board) (12) and packed into a package of a multi-chip semiconductor device not depicted in FIG. 1. In installing multi-chips 11, electrodes 111 of each IC bare chip of multi-chips 11 are electrically connected with PC electrodes 121 of PC board 12 respectively, and PC electrodes 121 are connected with outer electrodes, not depicted in FIG. 1, of the package.

In order to obtain high reliability of a semiconductor device, a burn-in test is performed after packaging, for testing whether the semiconductor device operates normally in a range of temperature, such as 100° C.~200° C. However, when the burn-in test is performed to the multi-chip semiconductor device after packaging, all the multi-chips must be rejected even if one multi-chip is inferior, in other words, the yield rate of production of the multi-chip semiconductor device decreases. This has been a problem in the related art.

Recently, user of semiconductor device tends to fabricate the multi-chip semiconductor device by himself for flexibly responding to functional variety of the multi-chip semiconductor device. Therefore, supplier of semiconductor device is required to perform the burn-in test to the IC bare chip before supplying it to the user. This is another problem newly occurs.

SUMMARY OF THE INVENTION

Therefore, an object of the present invention is to perform the burn-in test to the IC bare chip.

Another object of the present invention is to increase the yield rate of producing the multi-chip semiconductor device.

Still another object of the present invention is to reduce the production cost of the multi-chip semiconductor device.

Another object of the present invention is to carry the IC bare chip safely from the supplier to the user.

Further another object of the present invention is to increase the reliability of the IC bare chip and the multi-chip semiconductor device.

The above objects are achieved by providing an IC bare chip carrier installing an IC bare chip for performing the burn-in test of the IC bare chip with the carrier and carrying the IC bare chip from the supplier to the user of IC bare chips after the burn-in test.

The IC bare chip carrier consists of an installing unit for installing the IC bare chip, an interconnecting unit for electrically interconnecting chip electrodes on the IC bare chip and input electrodes of a burn-in test equipment, which is for supplying power and signals to the IC bare chip, and of a chip examination apparatus for electrically examining the function of the IC bare chip installed in the carrier, clamps for clamping the installing unit to the interconnecting unit so as to compose the carrier including the IC bare chip, and an airtight mechanism for sealing the IC bare chip in the carrier from the atmosphere around the carrier.

The installing unit has a depressed surface sized to the IC bare chip, for laying the IC bare chip. Since the IC bare chip is made of ceramic such as silicon having a small size such as 15.6 mm in width and depth and 0.5 mm in thickness and the integrated circuit is fabricated very delicately on the IC bare chip, the depressed surface is fabricated carefully so as to fit the IC bare chip. The material of the installing unit is selected so as to have large insulation resistance, heat resistance and mechanical strength and, in particular, to have an expansion rate near the expansion rate of ceramic such as silicon in a range of temperature being from room temperature to 200° C. In the embodiment of the present invention, the installing unit is made of aluminum nitride.

When inert gas such as nitrogen is filled around the IC bare chip by virtue of the airtight mechanism, the burn-in test can be performed without oxidizing the IC bare chip and transfer of the IC bare chip can be performed without contaminating the IC bare chip.

DESCRIPTION OF THE PREFERRED EMBODIMENTS

A first embodiment of the present invention will be described in reference to FIGS. 2 to 6 and a second embodiment of the present invention will be described in reference to FIGS. 7 to 9.

The first embodiment is an IC bare chip carrier having no air sealing mechanism and the second embodiment is an IC bare chip carrier having the air sealing mechanism. Throughout FIGS. 1 to 9, the same reference numeral designates the same part.

Figure 2:
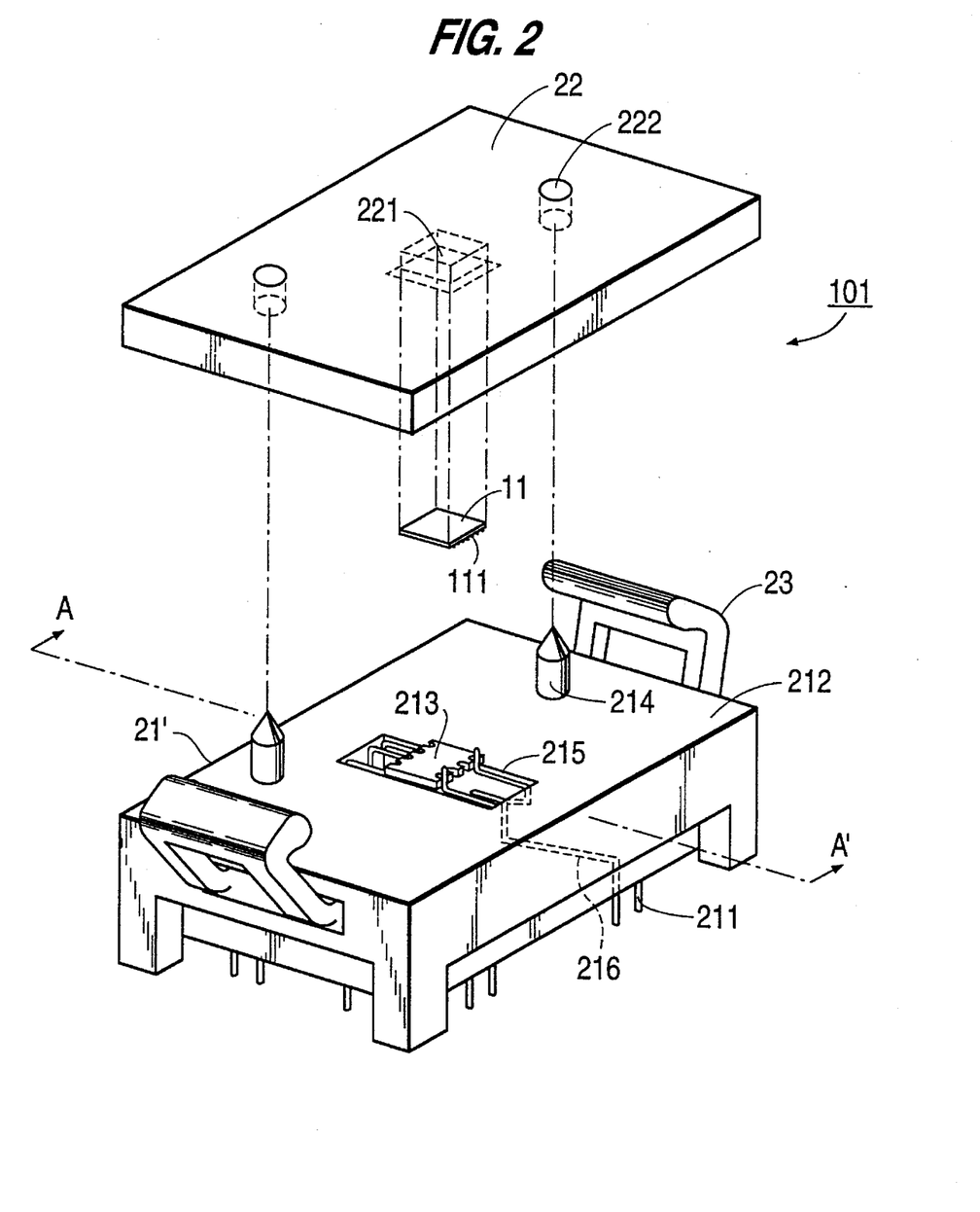
FIG. 2 is a schematic perspective view of an IC bare chip carrier of a first embodiment of the present invention.

FIG. 2 is a perspective view for illustrating an IC bare chip carrier 101 of the first embodiment of the present invention. The IC bare chip carrier 101 consists of an installing unit (INSTAL-UNIT) 22 for installing an IC bare chip 11, an interconnecting unit (INTERCON-UNIT) 21' for electrically interconnecting the IC bare chip 11 with the burn-in test equipment and the chip examination apparatus which are not depicted in FIG. 2, and clamps (CLAMPs) 23 for combining INSTAL-UNIT 22 with INTERCON-UNIT 21', composing the IC bare chip carrier 101.

The INSTAL-UNIT 22 has a depressed surface 221 for installing an IC bare chip 11 and at least two guide holes 222 used for combining INSTAL-UNIT 22 with INTERCON-UNIT 21'. Since the IC bare chip 11 is a thin (for example, 0.5 mm in thickness) plate made of silicon and minute integrated circuits are formed on the thin plate, the depressed surface 221 is fabricated precisely and material of INSTAL-UNIT 22 is selected so as to have large insulation resistance, heat resistance and mechanical strength and, in particular, an expansion rate near the expansion rate of ceramic such as silicon as much as possible in a temperature range used in the burn-in test, from room temperature to 200° C. In the preferred embodiments of the present invention, aluminum nitride is used as material for INSTAL-UNIT 22. Incidentally, the expansion rate of silicon is $7.63 \times 10^{-6\ mm/deg}$ and that of aluminum nitride is $4.1 \times 10^{-6\ mm/deg}$.

The INTERCON-UNIT 21' has a combining surface 212 which touches INSTAL-UNIT 22 when INSTAL-UNIT 22 is combined with INTERCON-UNIT 21', a chip pedestal 213 standing out from the combining surface 212 for laying the IC bare chip 11 thereon when the INSTAL-UNIT 22 installing the IC bare chip 11 is combined with INTERCON-UNIT 21', at least two guide pins 214 which run into guide holes 222 respectively when INSTAL-UNIT 22 is combined with INTERCON-UNIT 21', the output electrodes 211 of the IC bare chip carrier 101, to be connected with the burn-in test equipment and the chip examination apparatus which are not depicted in FIG. 2, springy or resilient electrodes 215 brought into contact with the chip electrodes 111 respectively when the INSTAL-UNIT 22 installing the IC bare chip 11 is combined with INTERCON-UNIT 21', and interconnecting wiring 216 for connecting the springy electrodes 215 with the output electrodes 211. The INTERCON-UNIT 21' is made of material having large insulation resistance, heat resistance and characteristics easy to fabricate the chip pedestal 213 and to lay the interconnecting wiring 216 internally. In the preferred embodiments of the present invention, polyetherimide resin (PEI) is used as material for INTERCON-UNIT 21'.

Figure 3:
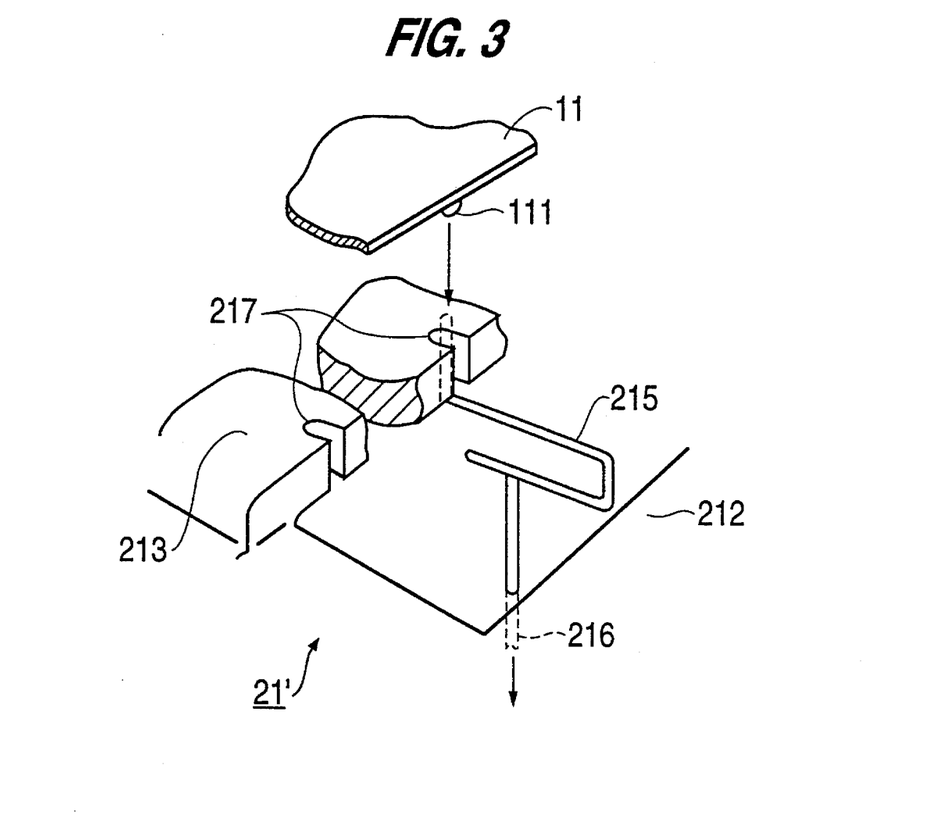
FIG. 3 is a schematic perspective view of one of the springy electrodes.

FIG. 3 is a schematic perspective view of one of the springy electrodes 215 for illustrating springy mechanism of the springy electrodes 215. In FIG. 3, ditches 217 are provided at ends of the chip pedestal 213 in corresponding to the chip electrodes 111 of the IC bare chip 11 respectively. Corresponding to each ditch 217, a pointed end of each springy electrode 215 is protruded from the chip pedestal 213, passing through the ditch 217 so as not to touch the inner surface of the ditch 217. The springy electrode has U's letter structure for obtaining spring action by which the pointed end of the springy or resilient electrode 215 can be touched to the chip electrode 111 tightly when INSTAL-UNIT 22 installing the IC bare chip 11 is combined with INTERCON-UNIT 21'.

In FIG. 2, when the IC bare chip has dimension such as 15.6 mm in width and depth and 0.5 mm in height, the size of INSTAL-UNIT 22 is 70 mm in width, 54 mm in depth and 7 mm in height and the size of INTERCON-UNIT 21' is 70 mm in width, 56 mm in depth and 24 mm in height.

Figure 4A:
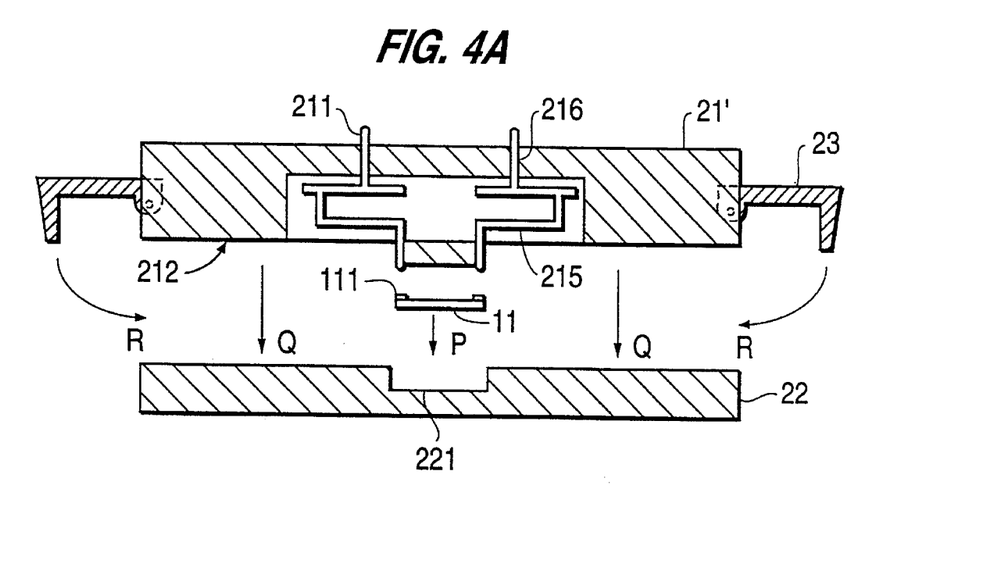
FIG. 4A is a schematic cross sectional view of the IC bare chip carrier of the first embodiment, for showing the IC bare chip carrier before an IC bare chip is installed therein.
Figure 4B:
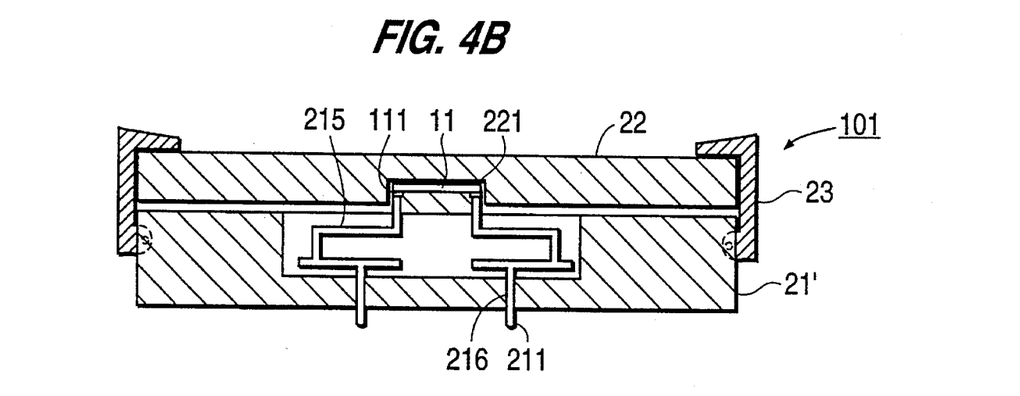
FIG. 4B is a schematic cross sectional view of the IC bare chip carrier of the first embodiment, for showing after the IC bare chip is installed therein.

FIGS. 4A and 4B are schematic cross sectional views of the IC bare chip carrier 101, for illustrating installation of the IC bare chip 11 in the IC bare chip carrier 101. FIGS. 4A and 4B are schematic cross sectional views of the IC bare chip carrier 101 through A—A' in FIG. 2. FIG. 4A shows the IC bare chip carrier 101 before the IC bare chip 11 is installed therein, and FIG. 4B shows the IC bare chip carrier 101 after the IC bare chip 11 is installed therein.

In FIG. 4A, INSTAL-UNIT 22 is laid horizontally so that the depressed surface 221 looks upward and the IC bare chip 11 is put on the depressed surface 221 as shown by arrow P by a special tool called "vacuum picker" so that the chip electrodes 111 look upward. After installing the IC bare chip 11 on the depressed surface 221, INTERCON-UNIT 21' is put on INSTAl-unit 22 as shown by arrow Q, making guide pins 214 pass through guide holes 222, then INTERCON-UNIT 21' is clamped with INSTAL-UNIT 22 by turning CLAMPs 23 as shown by arrow R.

When INTERCON-UNIT 21' and INSTAL-UNIT 22 are combined to each other, the chip electrodes 111 contact the pointed ends of the springy electrodes 215, pushing the springy electrodes 215 as shown in FIG. 4B in which the IC bare chip carrier 101 is depicted upside down in comparison with that in FIG. 4A.

In FIGS. 4A and 4B, it is of course that the installation of the IC bare chip 11 must be performed in the very clean atmosphere.

Figure 5A:
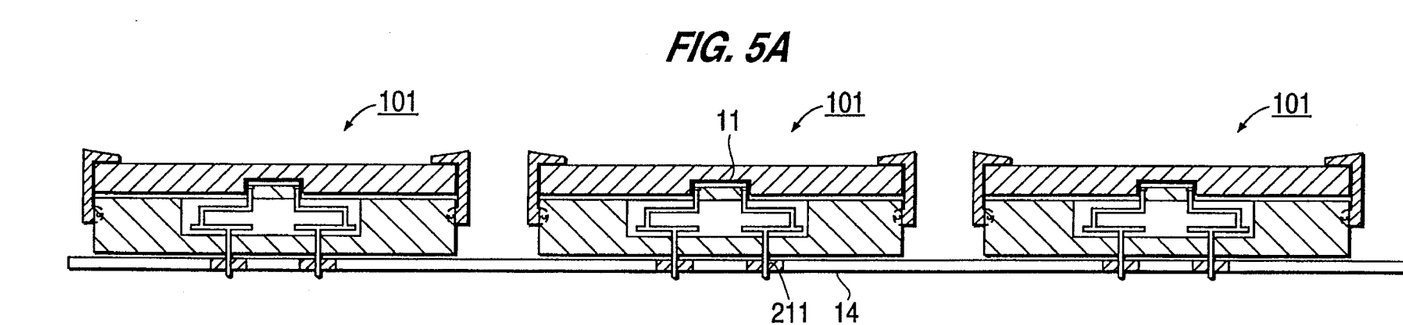
FIG. 5A is an illustration for showing that IC bare chip carriers of the present invention are mounted on a printed wiring board for performing a burn-in test of the IC bare chips in the carriers.
Figure 5B:
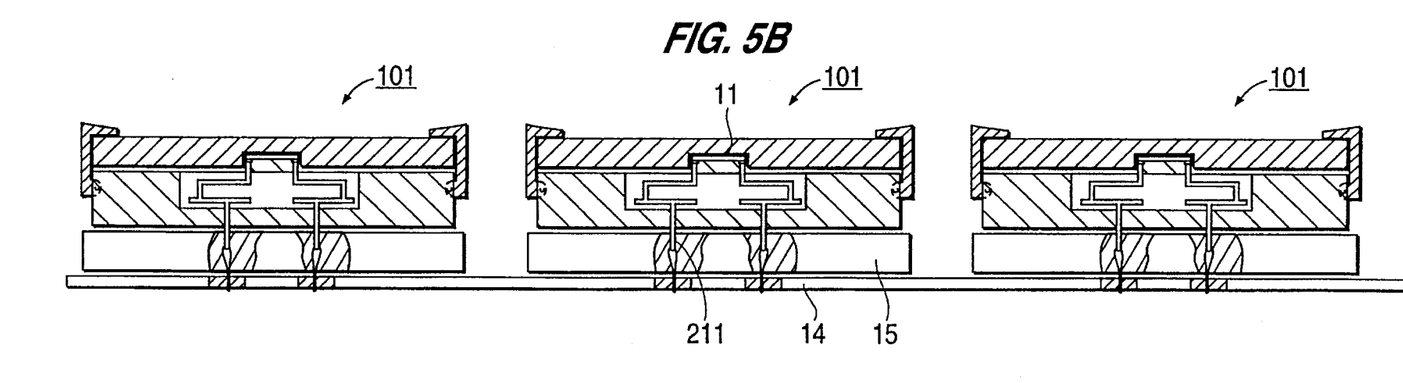
FIG. 5B is an illustration for showing that sockets are previously mounted on the printed wiring board by soldering and the IC bare chip carriers of the present invention are plugged in the sockets respectively.

After installing the IC bare chip 11 into the IC bare chip carrier 101, the burn-in test is performed to the IC bare chip 11 with the IC bare chip carrier 101 by using a test oven in which a designated temperature is always kept constant and the burn-in test equipment for supplying power and signals to the IC bare chip 11 put in the test oven. When the IC bare chip carrier 101 is put in the test oven, usually, a plurality of the IC bare chip carriers 101 are put into the test oven. FIG. 5A shows a case where the IC bare chip carriers 101 are mounted on a printed wiring board 14 by soldering the output electrodes 211 of the IC bare chip carrier 101 with through-holes of the printed wiring board 14, and FIG. 5B shows another case where a plurality of sockets 15 are previously mounted on the printed wiring board 14 by soldering and the IC bare chip carriers 101 are plugged in the sockets 15 respectively. The latter is convenient because the burn-in test can be performed without soldering.

Since the IC bare chips 11 are heated up to usually 125° C. to 200° C. in the test oven, the test oven is filled with inert gas such as nitrogen for preventing the IC bare chips 11 from being damaged. When a designated time is passed after the test oven is heated up to the designated temperature, the burn-in test is performed by applying source power and signals to the IC bare chips 11 through a bulkhead of the test oven not depicted in FIGS. 5A and 5B, wiring in the printed wiring board 14 and the socket 15, from the burn-in test equipment not depicted in FIGS. 5A and 5B.

Figure 6:
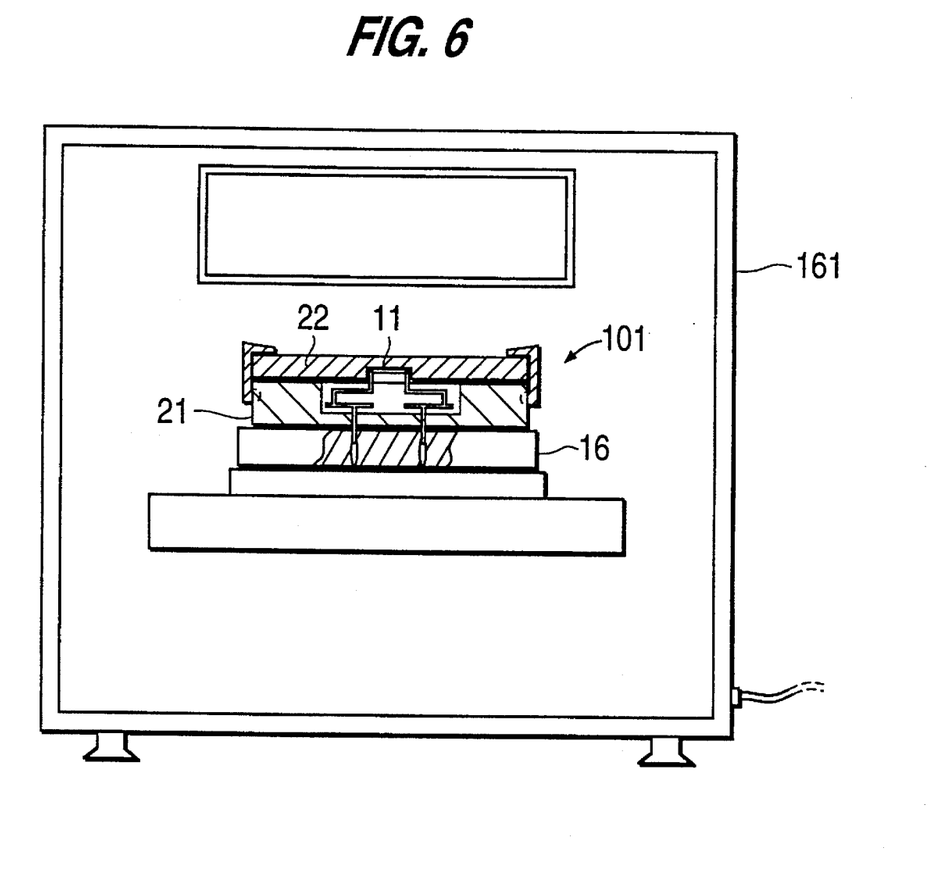
FIG. 6 is an illustration for showing a box of a chip examination apparatus, in which the IC bare chip carrier of the first embodiment is mounted, including an IC bare chip.

When the burn-in test is over and the temperature of the IC bare chips 11 in the test oven decrease to the room temperature, the IC bare chip carriers 101 are taken out from the test oven and put into a chip examination apparatus 16 for electrically examining the function of the IC bare chip 11, leaving the IC bare chip 11 in the IC bare chip carrier 101. Same as in FIG. 4B, the printed wiring board 13 and the socket 14 are previously set in a box 161 of the chip examination apparatus 16 as shown in FIG. 6. The function of the IC bare chip 11 is examined by using an electronic unit, not depicted in FIG. 6, of the chip examination apparatus 16. By virtue of using the IC bare chip carrier 101, the IC bare chip 11 can be prevented from being contaminated in transportation of the IC bare chip 11 from the test oven to the box 161 of the chip examination apparatus 16.

Figure 7:
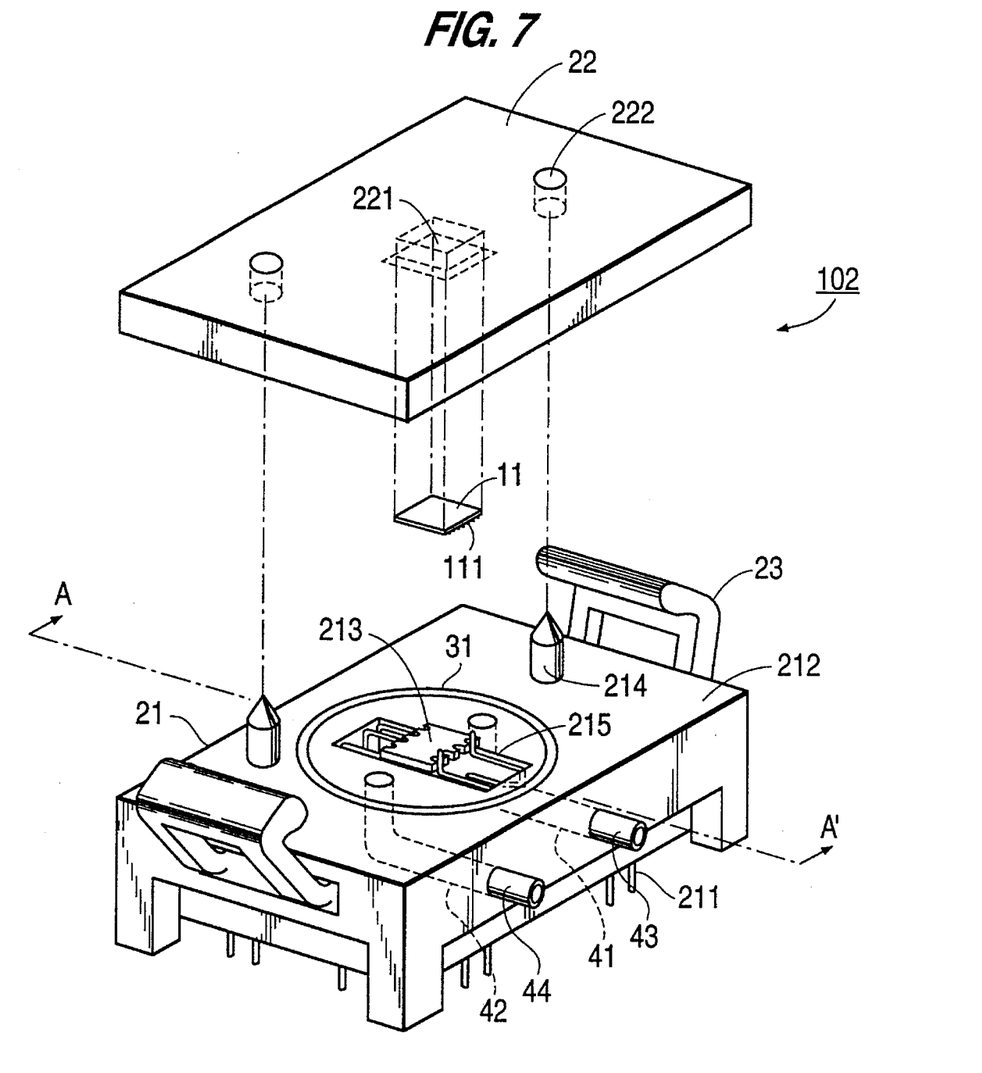
FIG. 7 is a schematic perspective view of an IC bare chip carrier of a second embodiment of the present invention.

FIG. 7 is a perspective view of an IC bare chip carrier 102, for illustrating a second preferred embodiment of the present invention. The IC bare chip carrier 102 is same as the IC bare chip carrier 101 except that an inert gas supplying mechanism is provided to INTERCON-UNIT 21' for always filling a space around the IC bare chip 11 with the inert gas as far as the IC bare chip 11 is installed in the IC bare chip carrier 102. In FIG. 7, an O ring 31 made of elastic material producing no gas in vacuum, for example, fluorinated rubber, is arranged on the combining surface 212 of an INTERCON-UNIT 21, enclosing the chip pedestal 213 and the springy electrodes 215 for sealing the IC bare chip 11 on the chip pedestal 213 by a surface having the depression surface 221 of INSTAL-UNIT 22 when INSTAL-UNIT 22 and INTERCON-UNIT 21 are combined to each other and clamped by CLAMP 23. An input pipe 41 and an output pipe 42 are provided in INTERCON-UNIT 21 so that ends of the input and output pipes 41 and 42 are opened at the combining surface 212 within the O ring 31 respectively and other ends of the input and output pipes 41 and 42 are led to the outside of INTERCON-UNIT 21 through an inlet valve 43 and an outlet valve 44 respectively.

After installing the IC bare chip 11 in the IC bare chip carrier 102 as described in reference to FIGS. 4A and 4B, the air in the space around the IC bare chip 11 made by the O ring 31 is evacuated by a vacuum pump connected with the outlet valve 44. Disconnecting the vacuum pump, the space is filled with nitrogen by a nitrogen gas cylinder connected to the inlet valve 43. Then, the space is continuously filled with nitrogen by disconnecting the nitrogen cylinder from the inlet valve 43. When the space around the IC bare chip 11 in the IC bare chip carrier 102 is filled with nitrogen, the burn-in test is performed as described in reference to FIGS. 5A and 5B by saving trouble of filling nitrogen in the test oven. After the burn-in test is over, the IC bare chip 11 is transferred to the box 161 of the chip examination apparatus 16 with the IC bare chip carrier 102 filled with nitrogen, and further the IC bare chip 11 is transferred from the supplier to the user of IC bare chip with the IC bare chip carrier 102 as the space around the IC bare chip 11 is filled with nitrogen.

The inlet valve 43 and the outlet valve 44 operate automatically when difference of gas pressure between inside and outside of the valves exceeds a designated value. When gas pressure at outside of the inlet valve 43 exceeds gas pressure at inside of the inlet valve 43 an amount of a designated value, the inlet valve 43 opens. When gas pressure inside of the outlet valve 44 increases gas pressure outside of the outlet valve 44 an amount of a designated value, the outlet valve 44 opens. The inlet valve 43 and the outlet valve 44 are articles on the market. In the second embodiment of the present invention, a valve having a commercial name, "QUICK COUPLER", is used for the inlet valve 43 and the outlet valve 44 respectively. The valve 43 or 44 is a gas coupler consisting of a plug and a socket, and a valve mechanism is provided in the socket. The size of the plug is 13 mm in diameter and 20 mm in length, and that of the socket is 15 mm in diameter and 38 mm in length.

Figure 8:
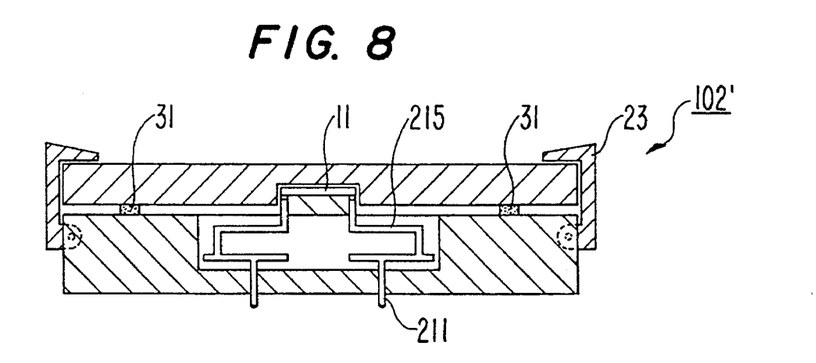
FIG. 8 is a schematic cross sectional view of an IC bare chip carrier being a different type of the second embodiment, having only an O ring for sealing the IC bare chip installed in the IC bare chip carrier.

FIG. 8 is a schematic cross sectional view of an IC bare chip carrier 102' only having the O ring 31, so that the IC bare chip 11 is only sealed from the outside of the IC bare chip carrier 102'. If the IC bare chip 11 is installed in the IC bare chip carrier 102' in inert gas, the burn-in test of the IC bare chip 11 can be performed with the IC bare chip carrier 102'. However, the installation of the IC chip 11 in the inert gas is not so easy to do. However, when the IC bare chip carrier 102 is used for transferring an IC bare chip from the supplier to the user of IC bare chip, the contamination of the IC bare chip can be prevented by the O ring 31.

Figure 9:
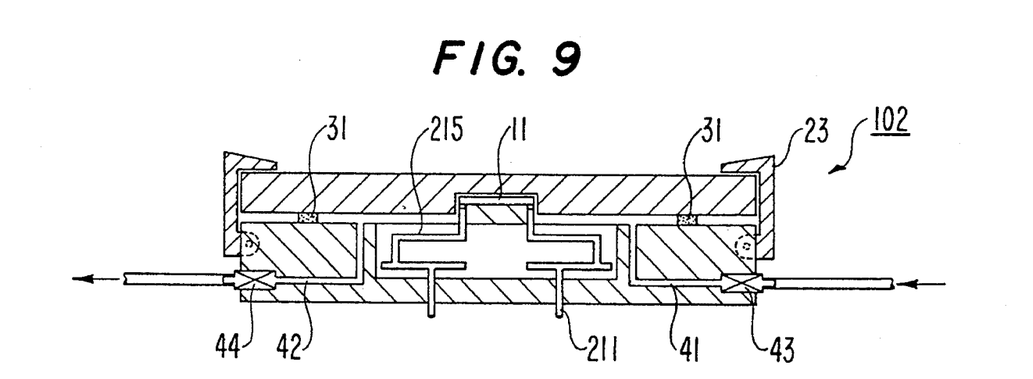
FIG. 9 is a schematic cross sectional view of the IC bare chip carrier of the second embodiment.

FIG. 9 is a schematic cross sectional view of the IC bare chip carrier 102 through A—A' in FIG. 7, for showing the IC bare chip carrier 102 having the O ring 31, the inlet valve 43 and the outlet valve 44.

In the first and the second embodiment, the IC bare chip carriers 101 and 102 install one IC bare chip 11 respectively and the chip examination is performed on one IC bare chip. However, an IC bare chip carrier for installing a plurality of IC bare chips can be developed and the chip examination can be performed on a plurality of IC bare chips.

What is claimed is:

1. An integrated circuit bare chip carrier for carrying an integrated bare chip installation therein, said integrated bare chip carrier comprising:

means for installing the integrated bare chip, said installing means comprising a depressed surface for installing the integrated bare chip;

interconnecting means combinable with said installing means, for electrically interconnecting chip electrodes on the integrated bare chip with exterior of said integrated bare chip carrier when said installing means installs the integrated bare chip and said installing means and said interconnecting means are combined to one another, said interconnecting means including resilient electrodes for contacting the chip electrodes respectively by using resilient action when said installing means and said interconnecting means are combined to one another and output electrodes for electrically connecting the chip electrodes with the exterior of said integrated circuit bare chip carrier when said installing means and said interconnecting means are combined to one another;

clamping means for clamping, and thereby combining, said installing means and said interconnecting means when said installing means and said interconnecting means are aligned adjacent to one another; and sealing means for producing a sealed space for the integrated bare chip and said resilient electrodes contacting with the electrodes of a chip respectively and for sealing the integrated bare chip and said resilient electrodes from outside of said integrated circuit bare chip carrier when said installing means and said interconnecting means are combined to one another and clamped by said clamping means.

2. An integrated circuit bare chip carrier according to claim 1, wherein said sealing means comprises an O ring made of elastic inert material arranged so as to enclose the sealed space when said installing means and said interconnecting means are combined to one another and clamped by said clamping means.

3. An integrated circuit bare chip carrier according to claim 1, wherein said interconnecting means further comprises air exchange means for exchanging air in the sealed space with inert gas by exhausting air from the sealed space and filling the sealed space with the inert gas after exhausting and for holding the sealed space in a state filled with the inert gas as far as said installing means and said interconnecting means are combined to one another and clamped by said clamping means.

4. An integrated circuit bare chip carrier according to claim 1, wherein said installing means comprises insulating material having expansion rate being the same order of the integrated bare chip's expansion rate.

5. An integrated circuit bare chip carrier according to claim 2, wherein said O ring comprises fluorinated rubber.

6. An integrated circuit bare chip carrier according to claim 4, wherein said insulating material of said installing means comprises aluminum nitride.

* * * * *

UNITED STATES PATENT AND TRADEMARK OFFICE
CERTIFICATE OF CORRECTION

PATENT NO.  :  5,534,785
DATED       :  July 9, 1996
INVENTOR(S) :  Tsutomu Yoshizaki, et al.

It is certified that error appears in the above-indentified patent and that said Letters Patent is hereby corrected as shown below:

Col. 4,    line 37, change "INSTAl-unit" to --INSTAL-unit--.

Col. 5,    line 16, change "13" to --14--;
           line 17, change "14" to --15--.

Signed and Sealed this

First Day of October, 1996

Attest:

BRUCE LEHMAN

Attesting Officer         Commissioner of Patents and Trademarks